United States Patent
Cao et al.

(10) Patent No.: US 12,261,168 B2
(45) Date of Patent: Mar. 25, 2025

(54) GATE METAL-INSULATOR-FIELD PLATE METAL INTEGRATED CIRCUIT CAPACITOR AND METHOD OF FORMING THE SAME

(71) Applicant: Efficient Power Conversion Corporation, El Segundo, CA (US)

(72) Inventors: Jianjun Cao, Torrance, CA (US); Gordon Stecklein, Van Nuys, CA (US); Muskan Sharma, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 458 days.

(21) Appl. No.: 17/672,215

(22) Filed: Feb. 15, 2022

(65) Prior Publication Data
US 2022/0262789 A1 Aug. 18, 2022

Related U.S. Application Data

(60) Provisional application No. 63/149,805, filed on Feb. 16, 2021.

(51) Int. Cl.
*H01L 27/06* (2006.01)
*H01L 21/8252* (2006.01)
(Continued)

(52) U.S. Cl.
CPC ...... *H01L 27/0629* (2013.01); *H01L 27/0605* (2013.01); *H01L 28/60* (2013.01);
(Continued)

(58) Field of Classification Search
CPC . H01L 27/0629; H01L 27/0605; H01L 28/60; H01L 29/2003; H01L 29/402; H01L 29/7786; H01L 29/404; H01L 21/8252
See application file for complete search history.

(56) References Cited

U.S. PATENT DOCUMENTS

| 8,975,664 B2 | 3/2015 | Saunier et al. |
| 9,064,709 B2 | 6/2015 | Then et al. |

(Continued)

FOREIGN PATENT DOCUMENTS

| TW | 2014/21647 A | 6/2014 |
| TW | 2014/35998 A | 9/2014 |

(Continued)

OTHER PUBLICATIONS

H. Xu et al., "Integration of $Ba_xSr_{1-x}TiO_3$ Thin Films With AlGaN/GaN HEMT Circuits," IEEE Electron Device Letters, vol. 25, No. 2, Feb. 2004.

(Continued)

*Primary Examiner* — Herve-Louis Y Assouman
(74) *Attorney, Agent, or Firm* — Blank Rome LLP

(57) ABSTRACT

An integrated circuit which includes a GaN FET and a metal-insulator-metal capacitor. The capacitor is fully integrated with a lateral GaN process flow, i.e., the same gate metal layer, field plate metal layer and dielectric layer of the GaN FET are also used to form the bottom plate, insulator and top plate of the capacitor. The top plate is contacted by a conductive via, which extends through the top plate. To increase the voltage breakdown capability of the capacitor of the integrated circuit, a portion of the gate metal layer is formed in the shape of a ring around the conductive via.

9 Claims, 10 Drawing Sheets

(51) Int. Cl.
   *H01L 29/20* (2006.01)
   *H01L 29/40* (2006.01)
   *H01L 29/778* (2006.01)
   *H01L 49/02* (2006.01)

(52) U.S. Cl.
   CPC ........ *H01L 29/2003* (2013.01); *H01L 29/402* (2013.01); *H01L 29/7786* (2013.01)

(56) References Cited

U.S. PATENT DOCUMENTS

| | | |
|---|---|---|
| 9,269,761 B2 | 2/2016 | Pan et al. |
| 10,153,273 B1 | 12/2018 | Tsai et al. |
| 2004/0061177 A1* | 4/2004 | Merchant ............ H01L 23/5223 257/349 |
| 2005/0042818 A1 | 2/2005 | Randazzo et al. |
| 2007/0235775 A1* | 10/2007 | Wu ..................... H01L 29/7787 257/E29.127 |
| 2009/0008679 A1* | 1/2009 | Saito ................. H01L 29/41766 257/199 |
| 2009/0230429 A1* | 9/2009 | Miyamoto ............ H01L 29/402 257/192 |
| 2014/0264247 A1 | 9/2014 | Daryanani et al. |
| 2015/0294936 A1 | 10/2015 | Shen et al. |
| 2016/0086938 A1 | 3/2016 | Kinzer |
| 2017/0018617 A1 | 1/2017 | Xia et al. |
| 2018/0097070 A1* | 4/2018 | Miura ..................... H01L 29/94 |
| 2021/0217883 A1* | 7/2021 | Jones ................. H01L 27/0733 |

FOREIGN PATENT DOCUMENTS

| | | |
|---|---|---|
| TW | 2014/44136 A | 11/2014 |
| TW | I610438 B | 1/2018 |
| WO | WO 2010/046881 A2 | 4/2010 |

OTHER PUBLICATIONS

G. Tang et al., "High-Capacitance-Density p-GaN Gate Capacitors for High-Frequency Power Integration," IEEE Electron Device Letters, vol. 39, No. 9, Sep. 2018.

H. Xu et al., "High Power GaN Oscillators using Field-Plated HEMT Structure", 2005 IEEE Mtt-S International Microwave Symposium, Piscataway, NJ, Jun. 12, 2005, pp. 1345-1348.

* cited by examiner

GATE METAL-INSULATOR-FIELD PLATE METAL INTEGRATED CIRCUIT CAPACITOR AND METHOD OF FORMING THE SAME

This application claims the benefit of U.S. Provisional Application No. 63/149,805, filed on Feb. 16, 2021, the entire disclosure of which is hereby incorporated by reference.

FIELD OF THE INVENTION

The present invention relates generally to an integrated circuit containing a transistor and a capacitor, and more particularly to an integrated circuit containing a transistor and a capacitor that share common metal layers and dielectric.

BACKGROUND

Transistors are often integrated with other electrical components, such as capacitors. For example, U.S. Pat. No. 10,153,273 discloses an FET transistor and a metal-insulator-metal capacitor fabricated in a single integrated circuit. However, the metal-insulator-metal capacitor uses different metal layers than the transistor and therefore requires a separate process flow to make the device, which complicates the fabrication process.

It is known to form an integrated circuit with an FET and a metal-insulator-metal capacitor, where the capacitor has a bottom plate formed from the same metal layer as the date of the FET, a top plate formed from the same metal layer as a field plate overlaying the FET, and where the insulator between the plates of the capacitor is formed from the same dielectric layer overlaying the FET. However, in such a prior art integrated circuit, the field plate metal, which also serves as the top plate of the capacitor, must be a relatively thick (>200 nm) aluminum based film, so that it can act as an etch stop for a chemically selective etch of a via contact to the top plate of the capacitor. A thick aluminum field plate degrades the topology of the wafer surface and is disadvantageous, particularly in devices with multiple field plates.

Accordingly, it would be desirable to form an integrated circuit having an integrated gate metal layer-insulator layer-field plate layer capacitor with a field plate layer formed of a thin non-aluminum metal, in which the contact to the top plate of the capacitor is made without the top plate serving as an etch stop.

SUMMARY OF THE INVENTION

The present invention overcomes the above-noted disadvantages of the prior art by providing an integrated circuit that includes a GaN transistor and a metal-insulator-metal capacitor which is fully integrated with the lateral GaN process flow, i.e., the same gate metal layer, field plate metal layer and dielectric layer used in the GaN FET are also used to form the bottom plate, insulator and top plate of the capacitor. However, unlike the prior art described above, the field plate layer of the present invention is formed of non-aluminum metal layer (preferably TiN), which is relatively thin (~40 nm), and therefore does not have the disadvantages of the prior art noted above.

In accordance with the present invention, the top plate of the capacitor is preferably electrically contacted by a conductive via, but, unlike the prior art, the via passes through the top plate of the capacitor, since the top plate is not formed of aluminum and does not serve as an etch stop.

In a first embodiment of the present invention, a segment of the gate metal layer, rather than the field plate metal, serves as the etch stop for the conductive contact via.

In a second embodiment of the present invention, at least a portion of the bottom plate of the capacitor is formed in the shape of a ring around the conductive contact via for the top plate to increase the breakdown voltage of the capacitor in a first polarity.

In a further embodiment of the present invention, the etch stop for the conductive contact via is formed in the shape of a ring, such that the breakdown voltage of the capacitor is increased in both polarities.

In yet another embodiment of the invention, the capacitor is provided with three metal electrodes, where the third electrode is formed of second field plate metal layer above the first field plate metal layer, and a further dielectric layer common to the GaN FET is disposed between the first and second field plate layers to form the additional insulator layer of the capacitor.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings, in which like reference characters identify correspondingly throughout and wherein:

FIGS. 2 to 6 illustrate structures showing the process flow for forming the integrated circuit of FIGS. 1A and 1B;

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed, and that various structural, logical, and electrical changes may be made.

Figure 1A:
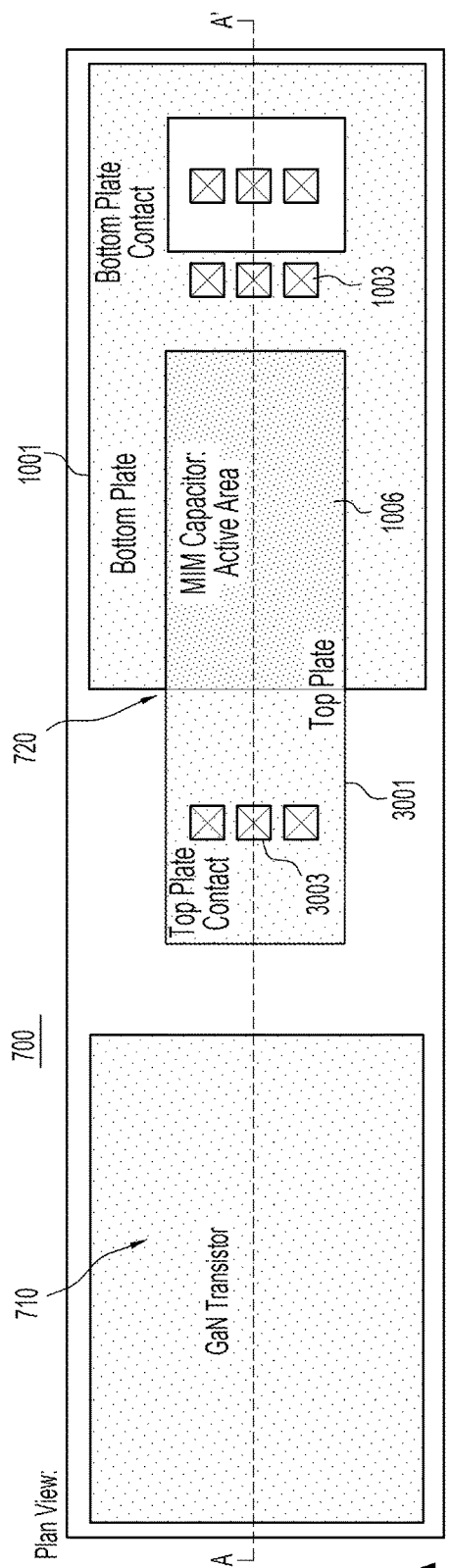
FIGS. 1A and 1B illustrate a plan view and a cross section view, respectively, of an integrated circuit including a field effect transistor (FET) and a capacitor in accordance with a first embodiment of the present invention, with a circuit schematic of the capacitor and its connection to the 2DEG region shown in FIG. 1C.
Figure 1B:
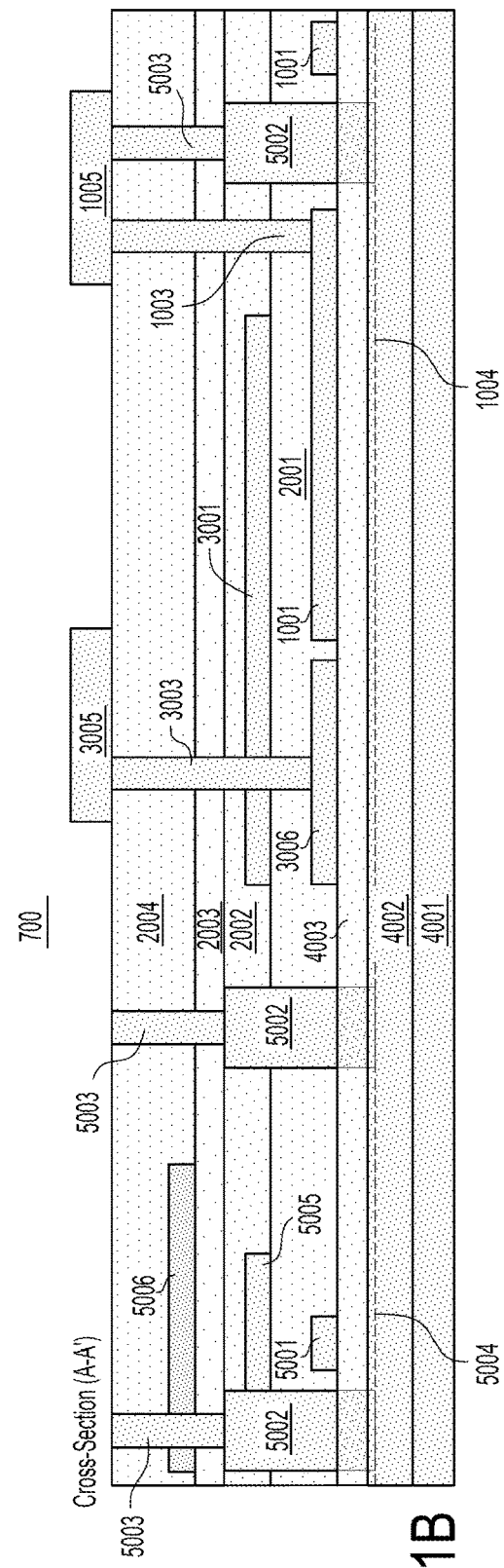

FIGS. 1A and 1B illustrate a plan view and a cross section view of an integrated circuit 700 in accordance with a first embodiment of the present invention, which includes both a field effect transistor (FET) 710 and a capacitor 720. The field effect transistor (FET) 710 is preferably a GaN FET. The capacitor 720 is a metal-insulator-metal capacitor with a bottom plate 1001 and a top plate 3001. As described below, capacitor 720 is fully integrated with the lateral fabrication process flow of GaN FET 710.

Integrated circuit 700 includes the substrate 4001, gallium nitride (GaN) layer 4002 on the substrate 4001, and aluminum gallium nitride (AlGaN) front barrier layer 4003 over the GaN layer 4002. The two-dimensional electron gas (2DEG) region 5004, formed at the interface between GaN layer 4002 and front barrier layer 4003, extends laterally across and under bottom plate 1001 of the capacitor, where it is identified by reference number 1004.

Integrated circuit 700 further includes gate metal 5001 of GaN transistor 710, formed of a gate metal layer, preferably TiN (500-2000 Å thick). The same metal layer, laterally across, forms bottom plate/electrode 1001 of capacitor 720. Similarly, top plate/electrode 3001 of capacitor 710 is formed of the same conductive metal layer (preferably TiN) as field plate 5005, which is disposed over GaN transistor 710. Advantageously, unlike the prior art, the field plate metal layer forming field plate 5005 and top plate 3001 does not contain aluminum and is a thin metal (preferably, TiN) having a thickness of 50-1000 Å. Because the field plate metal (which forms top plate 3001) does not contain aluminum, it cannot serve as an etch stop, and the via 3003 to contact the top plate passes through top plate 3001. In the first embodiment of the invention shown in FIG. 1B, conductive via 3003, preferably a tungsten plug, contacts and extends through top plate 3001, continues through first interlayer dielectric (insulation) layer 2001 (preferably Si₃N₄) and stops at an isolated segment 3006 of the gate metal layer, which serves as an etch stop. The bottom plate 1001 of the capacitor is electrically connected to the underlying 2DEG region 1004 by bottom plate contact via 1003, routing metal 1005, Ohmic contact via 5003, and Ohmic contact 5002.

Integrated circuit 700 also includes second interlayer dielectric 2002, third interlayer dielectric 2003 and fourth interlayer dielectric 2004, which, like the metal layers and first interlayer dielectric 2001 are common to both GaN transistor 710 and capacitor 720. First interlayer dielectric 2001 serves as the insulator layer of capacitor 710. As shown in FIG. 1A, the overlapping region 1006 of capacitor bottom plate 1001 and top plate 3001 is the active area of the capacitor.

Figure 1C:
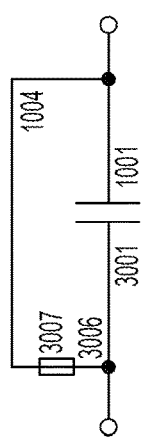

The above-described embodiment of FIGS. 1A and 1B is limited to a voltage on capacitor 720 of approximately 6 volts, beyond which the etch stop 3006, conductively connected to top plate 3001, will short to the 2DEG 1004, as indicated by normally-open fuse 3007 in the schematic representation of capacitor 720 shown in FIG. 1C.

Figures 2, 3, 4:
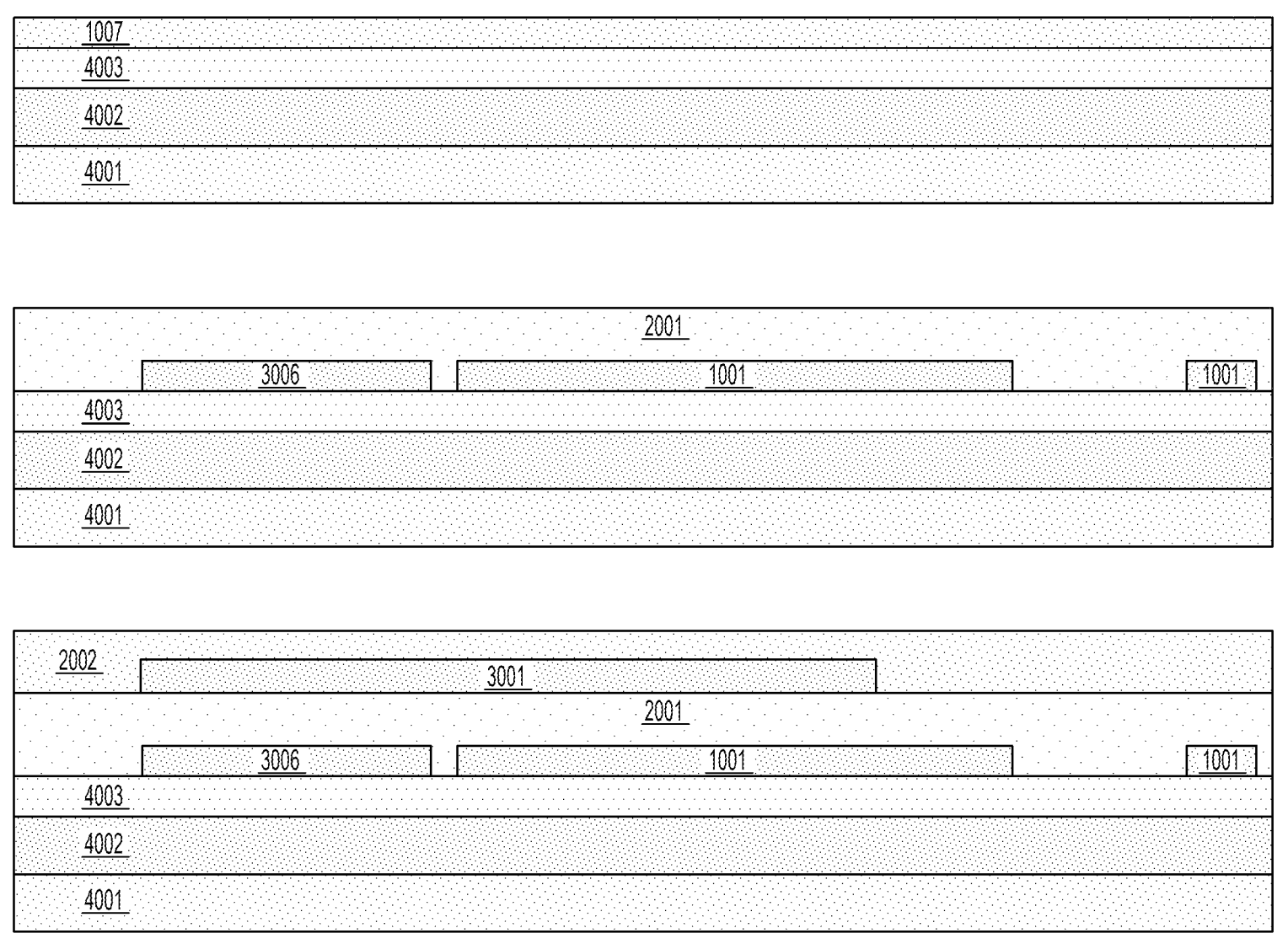

FIGS. 2 to 6 illustrate the semiconductor layer structure at various stages of forming integrated circuit 700, and accordingly illustrate the method of forming integrated circuit 700. Referring to FIG. 2, at the start of the process, gallium nitride (GaN) layer 4002 is disposed over the substrate 4001, and aluminum gallium nitride (AlGaN) front barrier layer 4003 is disposed over the GaN layer 4002. Gate metal layer 1007 is formed or deposited on the AlGaN front barrier layer 4003.

Referring to FIG. 3, in the second step of the process, the gate metal layer 1007 is etched with a patterned photo-resist mask to form capacitor bottom plate 1001, etch stop 3006, and transistor gate metal 5001 (FIG. 13), all from the same gate metal layer 1007. Next, first interlayer dielectric 2001 is deposited over capacitor bottom plate 1001, top plate etch stop 3006, and transistor gate metal 5001 and the AlGaN front barrier layer 4003.

Referring to FIG. 4, in the third step of the process, a first field plate metal layer (preferably TiN) is deposited on the first interlayer dielectric layer 2001, and is etched with a patterned photo-resist mask to form capacitor top plate 3001 and first field plate 5005 (FIG. 1B). Accordingly, capacitor top plate 3001 and first field plate 5005 are formed from the same metal layer. Next, a second interlayer dielectric 2002 is deposited over capacitor top plate 3001, first field plate 5005, and first interlayer dielectric layer 2001.

Figure 5:
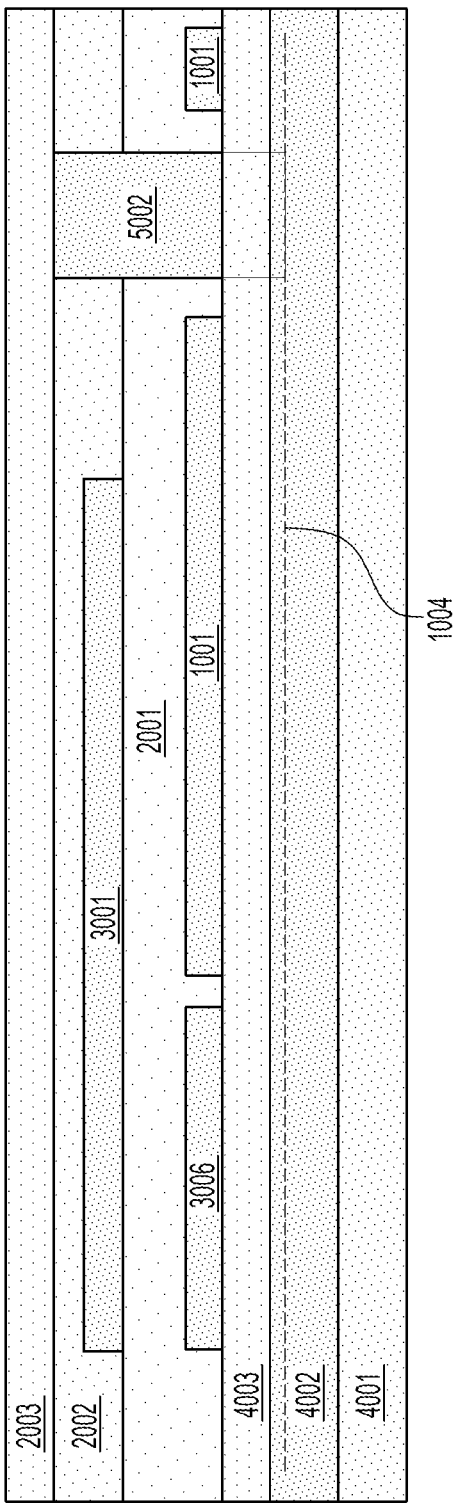

Referring to FIG. 5, in the fourth step of the process, an etch is performed through the dielectric to form a via, and metal is deposited into the via to form Ohmic contact metal 5002. A third interlayer dielectric 2003 is then deposited over Ohmic contact metal 5002 and second interlayer dielectric 2002.

Figure 6:
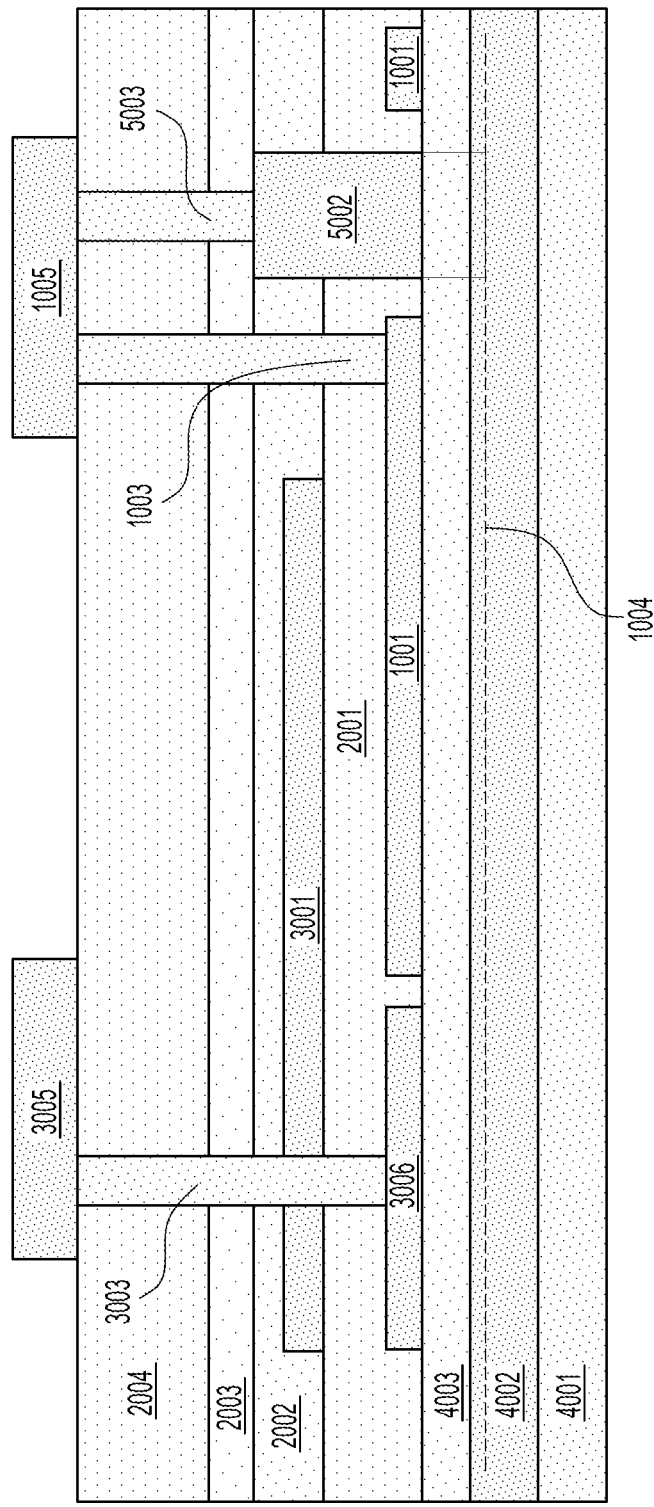

Referring to FIG. 6, in the final step of the process, a fourth interlayer dielectric 2004 is deposited on third interlayer dielectric 2003; via holes are patterned and etched; metal is deposited into the via holes and planarized by chemical mechanical planarization (CMP) to form top plate contact 3003 (i.e., electrical contact to capacitor top plate), bottom-plate contact 1003 (i.e., electrical contact to capacitor bottom plate), and electrical contact 5003 to Ohmic metal 5002. The bottom-plate contact 1003, the top-plate contact 3003, and the contact 5003 to Ohmic metal contact 5002 are preferably each a tungsten plug via.

Further, metal (such as AlCu or AlSiCu) is deposited on the upper surface (over fourth interlayer dielectric 2004, top-plate contact 3003, bottom-plate contact 1003, and the contact 5003 to Ohmic contact metal 5002), and then patterned and etched to form bottom plate routing metal 1005 and top plate routing metal 3005.

Figure 7A:
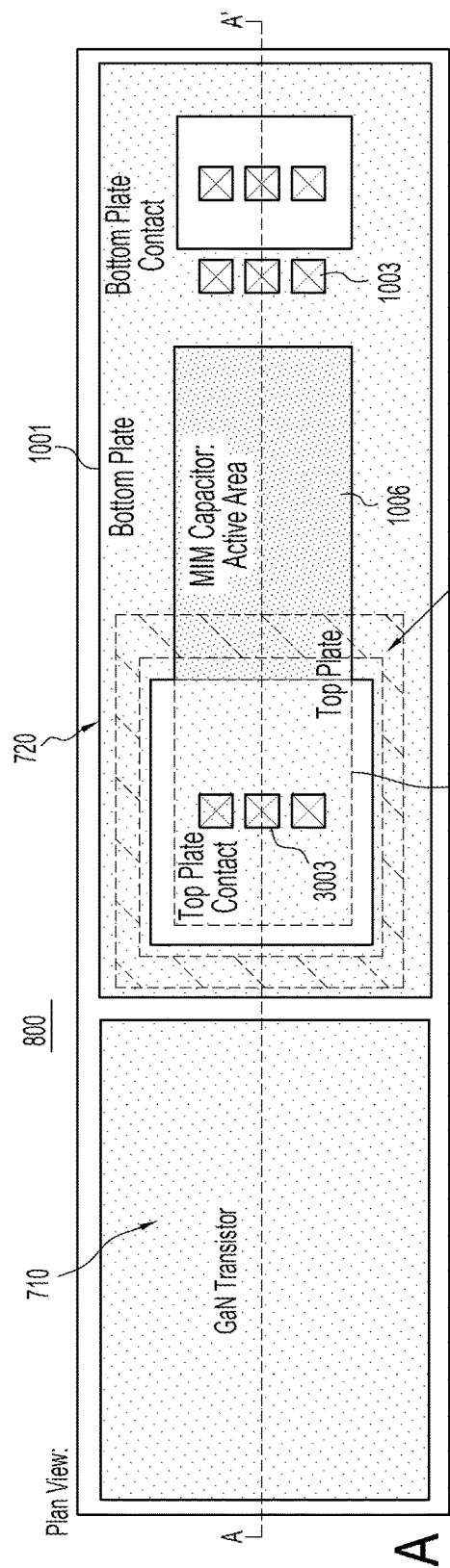
FIGS. 7A and 7B illustrate a plan view and a cross section view, respectively, of an integrated circuit in accordance with a second embodiment of the present invention, with a circuit schematic of the capacitor and its connection to the 2DEG region shown in FIG. 7C.
Figure 7B:
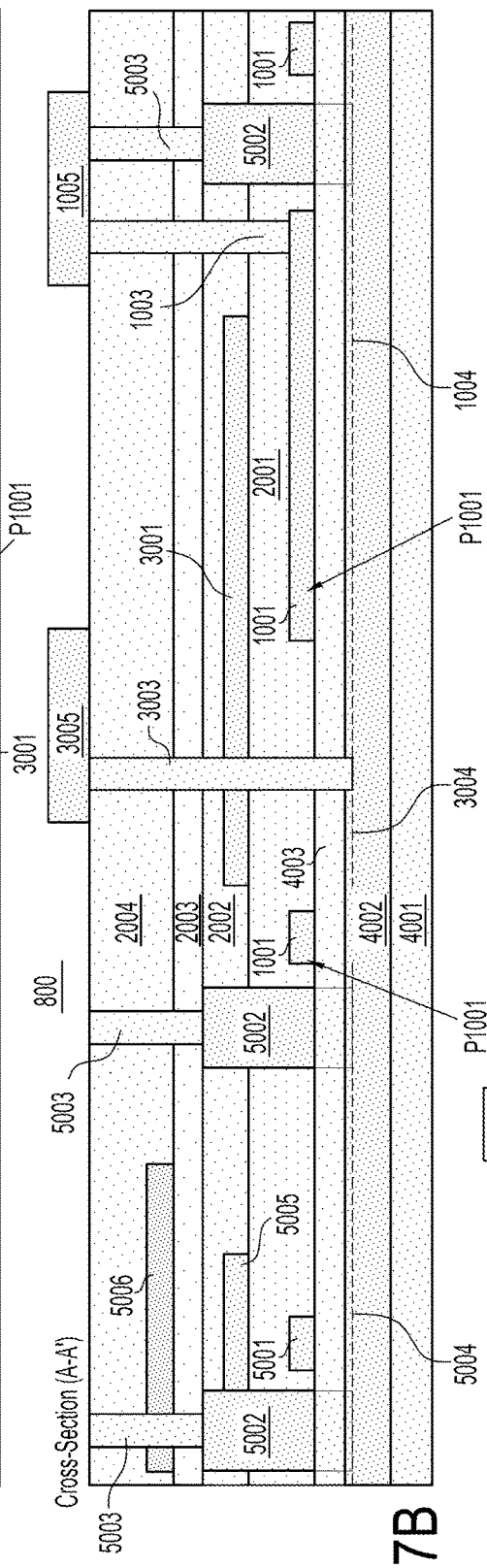

FIGS. 7A and 7B illustrate a plan view and a cross section view of a second embodiment of the invention, integrated circuit 800, which does not have the capacitor breakdown voltage limitation of the first embodiment. Many components of integrated circuit 800 and much of the process of forming integrated circuit 800 is the same or similar to the above-described integrated circuit 700 (FIGS. 1A and 1B) and its formation method (FIGS. 2-6).

Figure 7C:
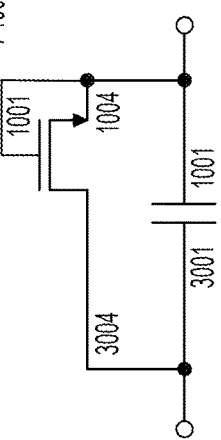

Integrated circuit 800 is similar to integrated circuit 700 of the first embodiment, but without the etch stop 3006; thus, in the second embodiment, top-plate contact (top-plate via) 3003 extends through front barrier layer 4003 to contact the underlying 2DEG 3004. With the top plate 3001 and bottom plate 1001 now both electrically connected to the 2DEG 3004, it is necessary to provide a diode in the structure to prevent the plates of the capacitor from being shorted by conduction through the 2DEG. To form a diode, the capacitor bottom plate 1001 of the capacitor 720 is formed to include a ring-shape portion P1001 surrounding or enclosing top-plate contact 3003, thereby preventing conduction from 2DEG region 3004 under top-plate contact 3003 (which is conductively connected to top plate 3001) to 2DEG region 1004 under Ohmic contact 5002 (which is conductively connected to bottom plate 1001), and preventing the top plate 3001 from shorting to the bottom plate 1001. The ring-shape of portion P1001 can be any suitable annular shape (e.g., circular, rectangular, or triangular). As shown in the circuit schematic of FIG. 7C, the ring formed by capacitor bottom plate 1001 serves as a gate of a FET in a diode configuration. When capacitor top plate 3001 is at a higher voltage than capacitor bottom plate 1001, the ring-shape of portion P1001 (with the diode configuration of the FET formed by the connection of gate metal 1001 to 2DEG 1004) prevents conduction from 2DEG region 3004 to 2DEG region 1004, preventing conduction from the top plate 3001 to the bottom plate 1001 (i.e., preventing the capacitor from shorting), even if capacitor 720 is biased by more than approximately 6 volts.

Figure 8:
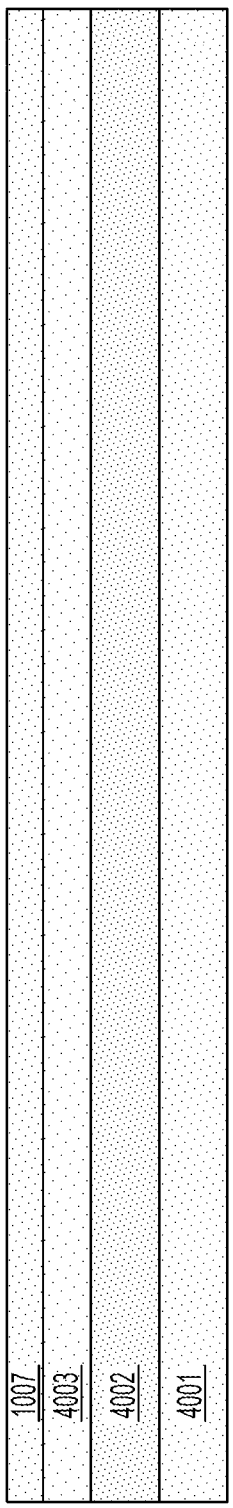
FIGS. 8 to 12 illustrate structures at various stages of forming the integrated circuit of FIGS. 7A and 7B.
Figure 9:
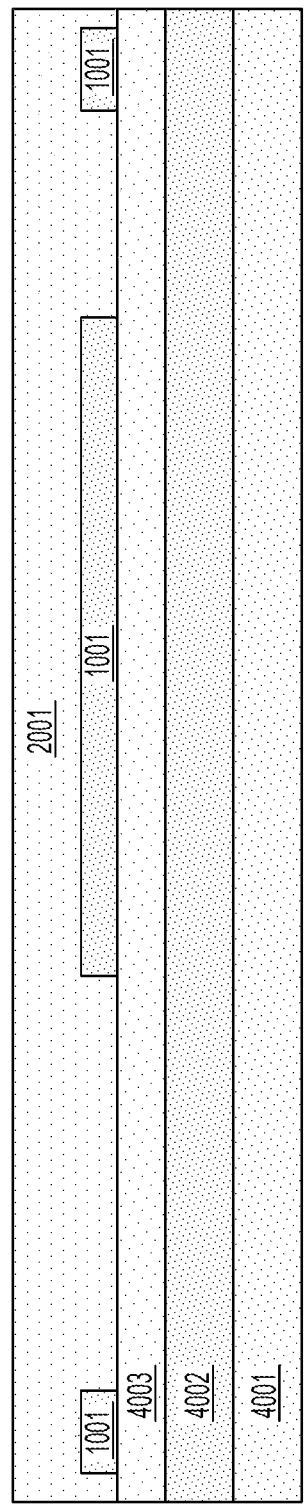
Figure 10:
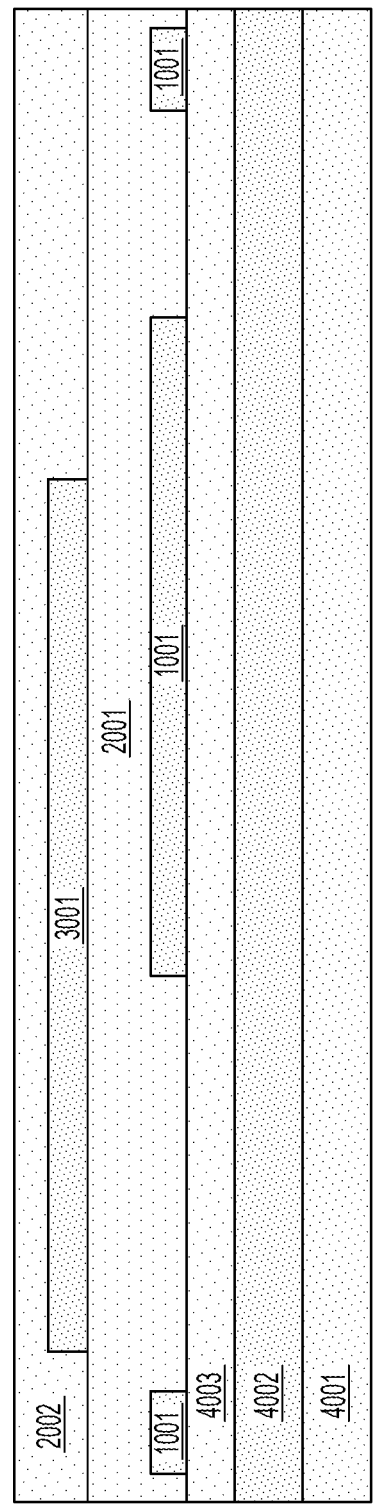
Figure 11:
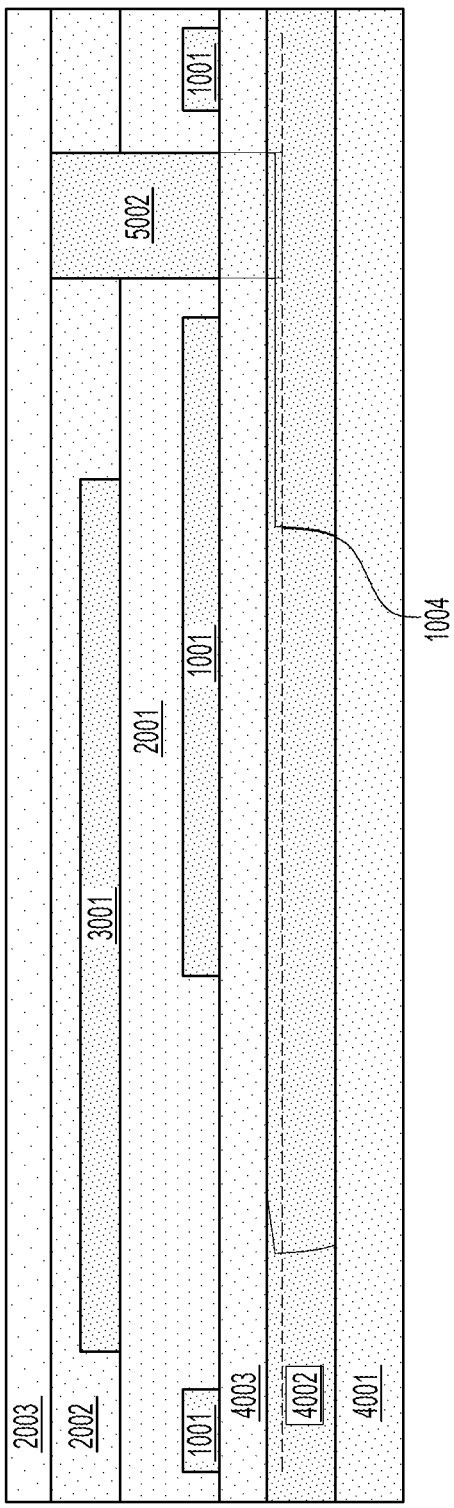
Figure 12:
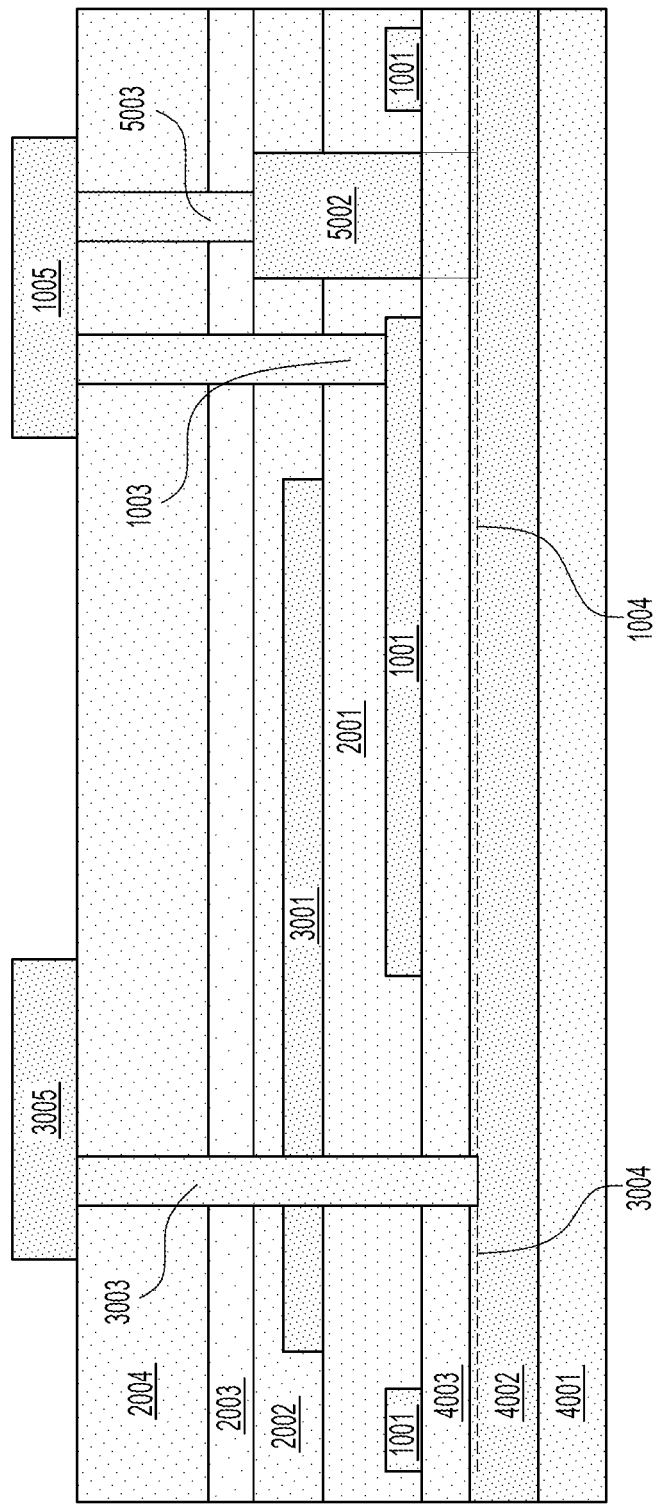

FIGS. 8 to 12 illustrate structures at various stages of forming integrated circuit 800, and accordingly illustrate method of forming integrated circuit 800. The structures and processes of FIG. 8, 10, 11 are the same as, or similar to, the structures and processes of FIGS. 2, 4, and 5. However, in contrast to FIG. 3, in FIG. 9, the gate metal layer 1007 is formed such that the capacitor bottom plate 1001 of the capacitor 720 has a ring shape or a ring-shape portion. Further, no top plate etch stop 3006 is formed in FIG. 9. Thus, in contrast to FIG. 3, in FIG. 12, top-plate contact (e.g., top-plate via) 3003 extends to, and contacts, 2DEG layer 3004, as described above.

Figure 13A:
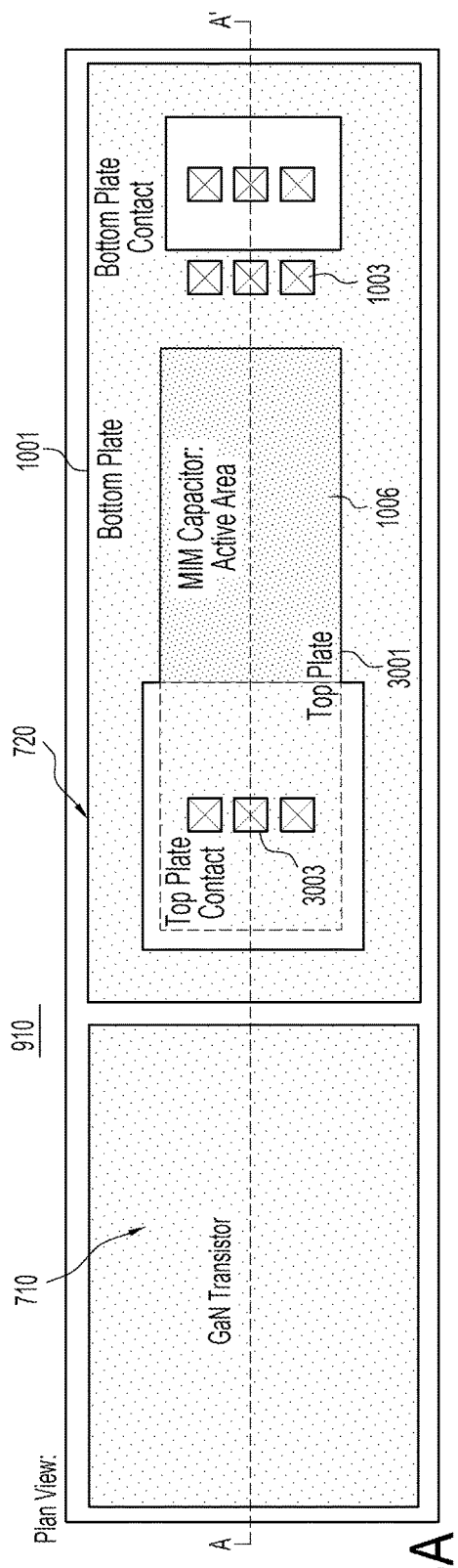
FIGS. 13A and 13B illustrate a plan view and a cross section view of another embodiment of the integrated circuit of the present invention.
Figure 13B:
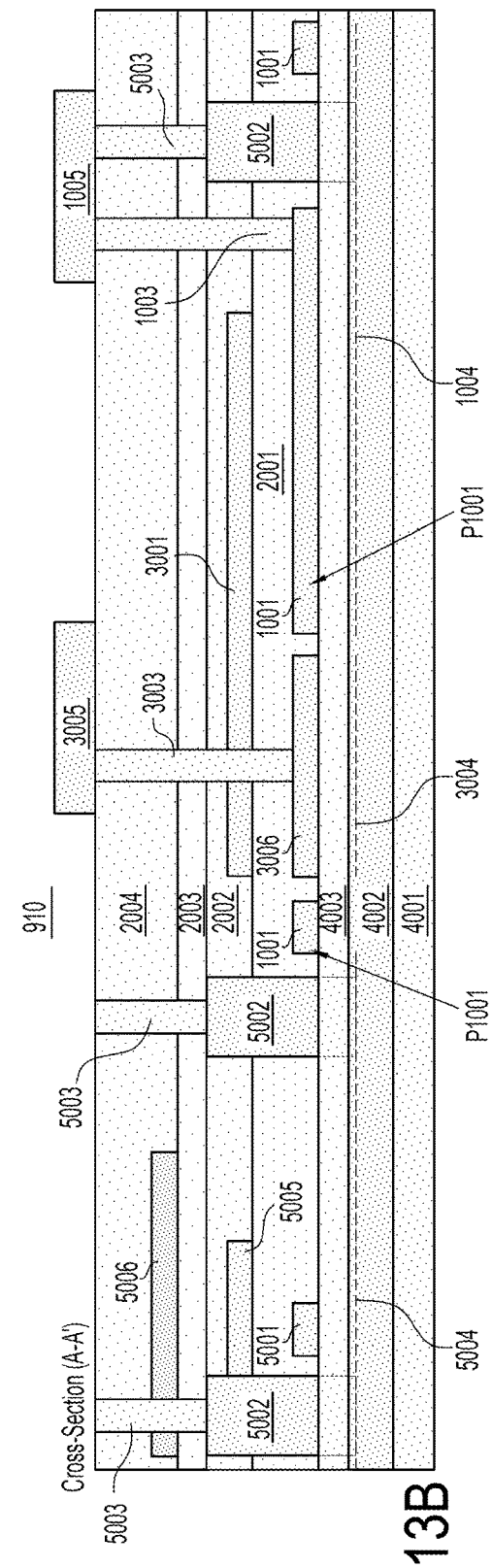

FIGS. 13A and 13B illustrate a plan view and a cross section view of integrated circuit 910, a further embodiment of the invention which combines the bottom plate gate metal ring 1001 of the second embodiment with the etch stop 3006 of the first embodiment.

The capacitor 720 of integrated circuit 910 includes both the ring-shaped bottom electrode 1001 of the second embodiment and the etch stop 3006 of the first embodiment. Like the capacitor of the second embodiment shown in FIG. 7B, capacitor 720 of integrated circuit 910 can support higher voltages in a first polarity direction (from top plate to bottom plate, when the top electrode is at a higher voltage than the bottom electrode) since bottom plate 1001 includes a ring-shape portion P1001 surrounding top plate etch stop 3006, as compared to the capacitor of FIG. 1B, which lacks a ring-shaped portion for forming the breakdown blocking diode.

Figure 14A:
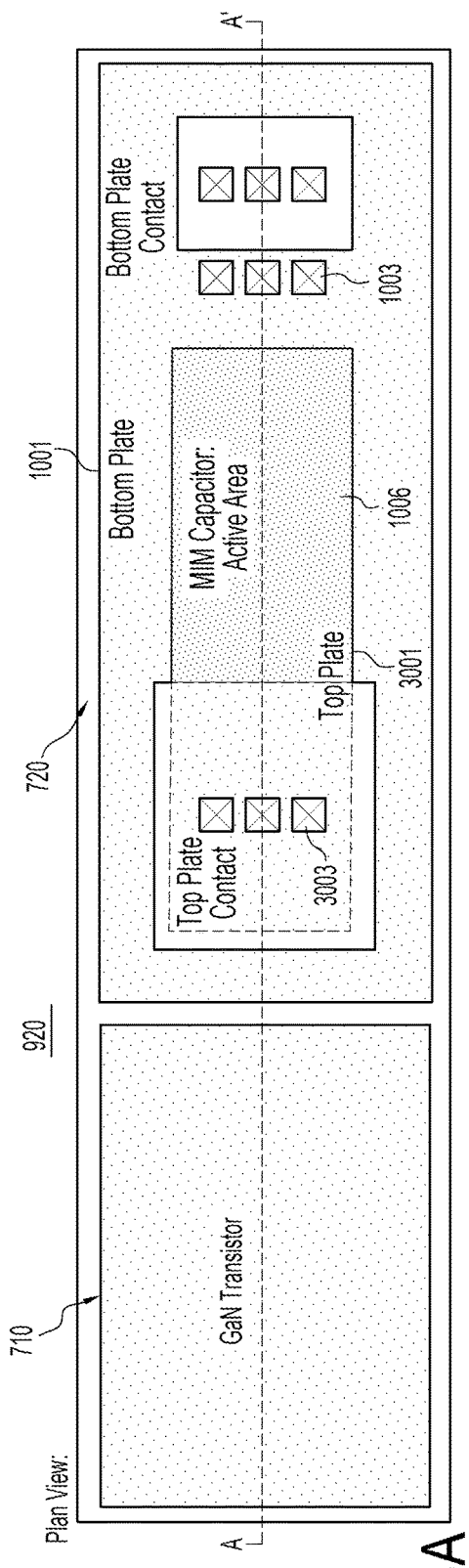
FIGS. 14A and 14B illustrate a plan view and a cross section view of yet another embodiment of the integrated circuit of the present invention.
Figure 14B:
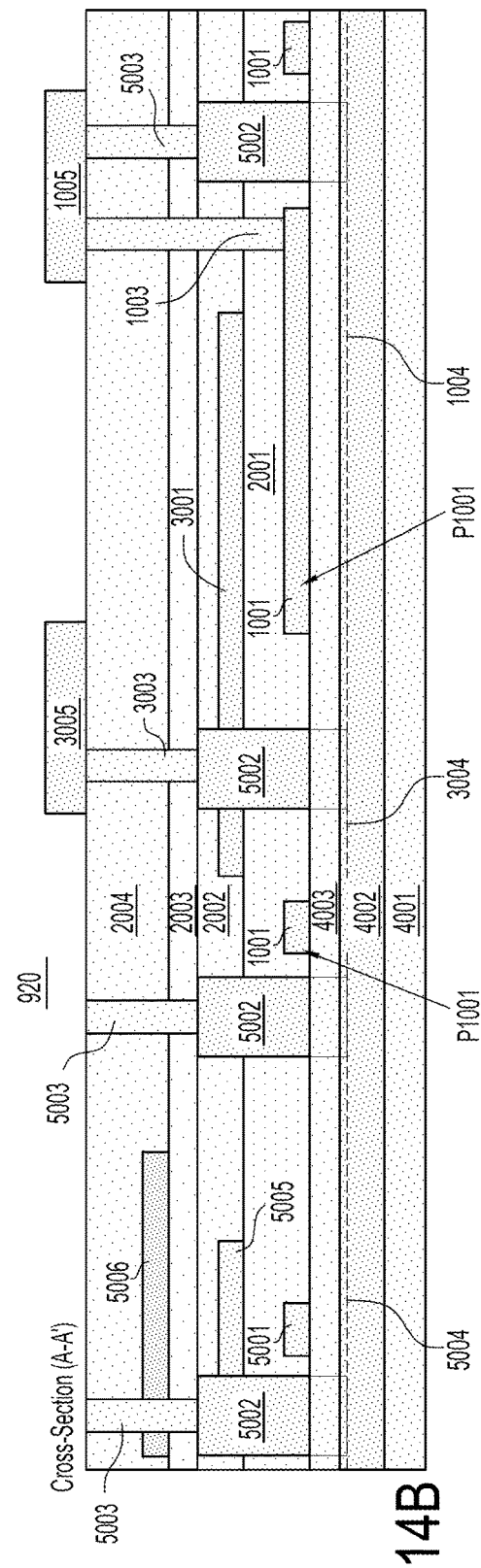

FIGS. 14A and 14B illustrate a plan view and a cross section view of integrated circuit 920, a further embodiment of the present invention in which the contact 3003 is conductively connected to the top plate 3001 by an Ohmic metal contact 5002, which connects to the 2DEG 3004 under the top plate contact 3003, as shown. As in the previously described embodiments, the capacitor 720 of integrated circuit 920 supports high voltages (in a unilateral direction, from top plate to bottom plate) by configuring a portion of the bottom plate 1001 of the capacitor in a ring shape, as in the second embodiment.

Figure 15A:
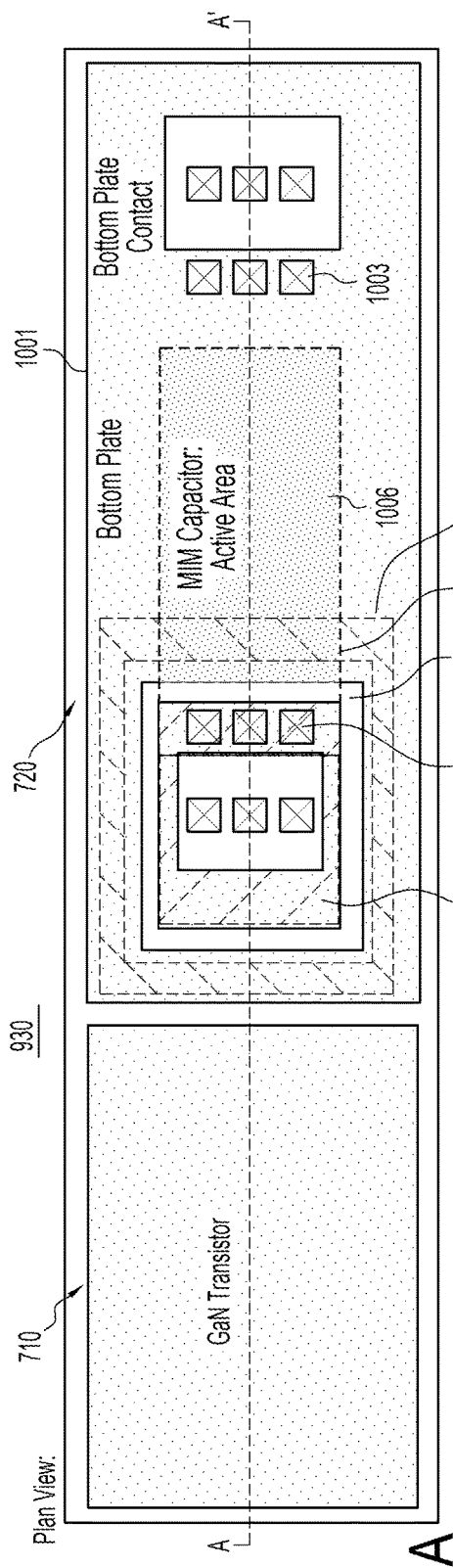
FIGS. 15A and 15B illustrate a plan view and a cross section view of a further embodiment of the integrated circuit of the present invention, with a circuit schematic of the capacitor and its connection to the 2DEG region shown in FIG. 15C.
Figure 15B:
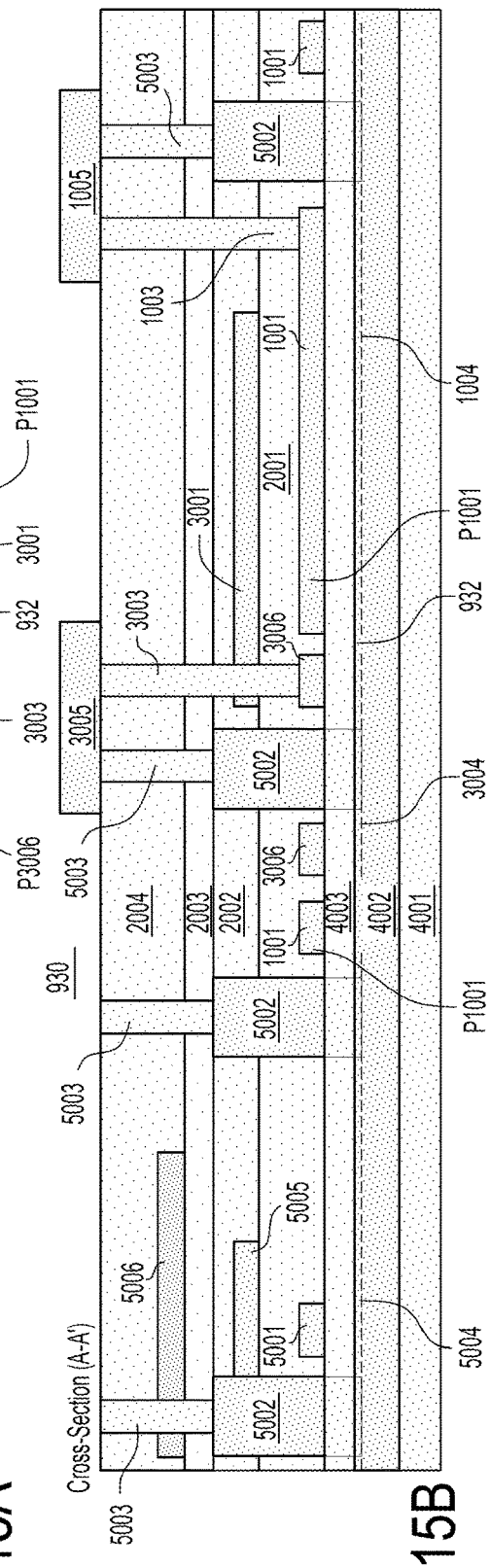

FIGS. 15A and 15B illustrate a plan view and a cross section view of integrated circuit 930, another embodiment of the invention which includes both an Ohmic metal contact 5002 to the underlying 2DEG for both the top plate and the bottom plate of the capacitor (as in the previous embodiment, FIG. 14B) and an etch stop 3006 for the top plate contact via 3003 (as in the first embodiment, FIG. 1B). Importantly, this embodiment of the invention provides increased voltage breakdown for the capacitor in both polarities. The etch stop 3006 is formed in a ring shape P3006 surrounding Ohmic contact metal 5002 of top plate 3001 to prevent conduction between 2DEG layer 3004 (under Ohmic metal contact 5002 of top plate 3001) and 2DEG region 1004 (under Ohmic contact metal 5002 of the bottom plate 1001) in a second polarity direction, where the ring-shaped portion P3006 serves as a gate of a FET configured as a diode. The second polarity direction corresponds to the bottom electrode 1001 being at a higher voltage than the top electrode 3001 of capacitor 720; i.e., the second polarity direction is opposite to the first polarity direction. The ring-shape portion P1001 of the bottom plate 1001 surrounds Ohmic contact metal contact 5002 of top plate 3001 and the etch stop 3006, to prevent conduction between 2DEG layer 3004 (under Ohmic metal contact 5002 of top plate 3001) and 2DEG region 1004 (under Ohmic contact 5002 of the bottom plate 1001) in the first polarity direction, where the ring-shaped portion P1001 effectively serves as a gate of another FET configured as a diode (similar to the embodiment of FIGS. 7A-7C).

Figure 15C:
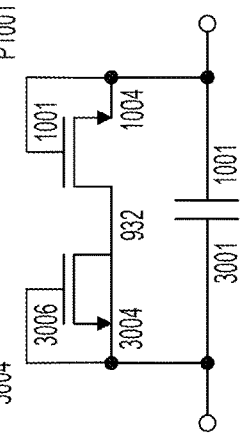

The schematic diagram of FIG. 15C illustrates how the ring-shaped etch stop 3006 and ring-shaped bottom plate 1001 each form a respective FET in a diode configuration to prevent voltage breakdown across the capacitor in both directions. The diode of ring-shaped bottom plate 1001 and the diode of the ring-shaped etch stop 3006 are arranged in a back-to-back configuration, separated by 2DEG region 932 under a ring-shape gap region between the ring-shaped etch stop 3006 and ring-shaped bottom plate 1001. The back-to-back diode configuration blocks current from voltage breakdown in both (opposite) directions. Thus, when capacitor top plate 3001 is at a positive voltage with respect to capacitor bottom plate 1001, the blocking diode of ring-shaped bottom plate 1001 prevents current flow through 2DEG region 932 in a first polarity direction (which would short the capacitor); and when capacitor top plate 3001 is at a negative voltage with respect to capacitor bottom plate 1001, the blocking diode of the ring-shaped etch stop 3006 prevents current flow through 2DEG region 932 in an opposite direction (which would short the capacitor).

Thus, implementation of the back-to-back diode configuration as shown in FIGS. 15A, 15B and 15C results in a structure which does not have the capacitor breakdown voltage limitation of the first embodiment and does not have single polarity breakdown limitation of the second embodiment, thereby allowing capacitor 720 to handle voltages of more than 6 volts in either polarity, without breakdown.

As shown in FIG. 15B, top plate 3001 is conductively connected to 2DEG 3004 via top-plate contact via 3003, routing metal 3005, contact via 5003 and Ohmic contact metal 5002. However, top plate 3001 can alternately be conductively connected to 2DEG 3004 by extending top plate 3001 to Ohmic contact 5002 that is in contact with 2DEG 3004 (as shown in FIG. 14B) or by any other suitable way.

Figure 16A:
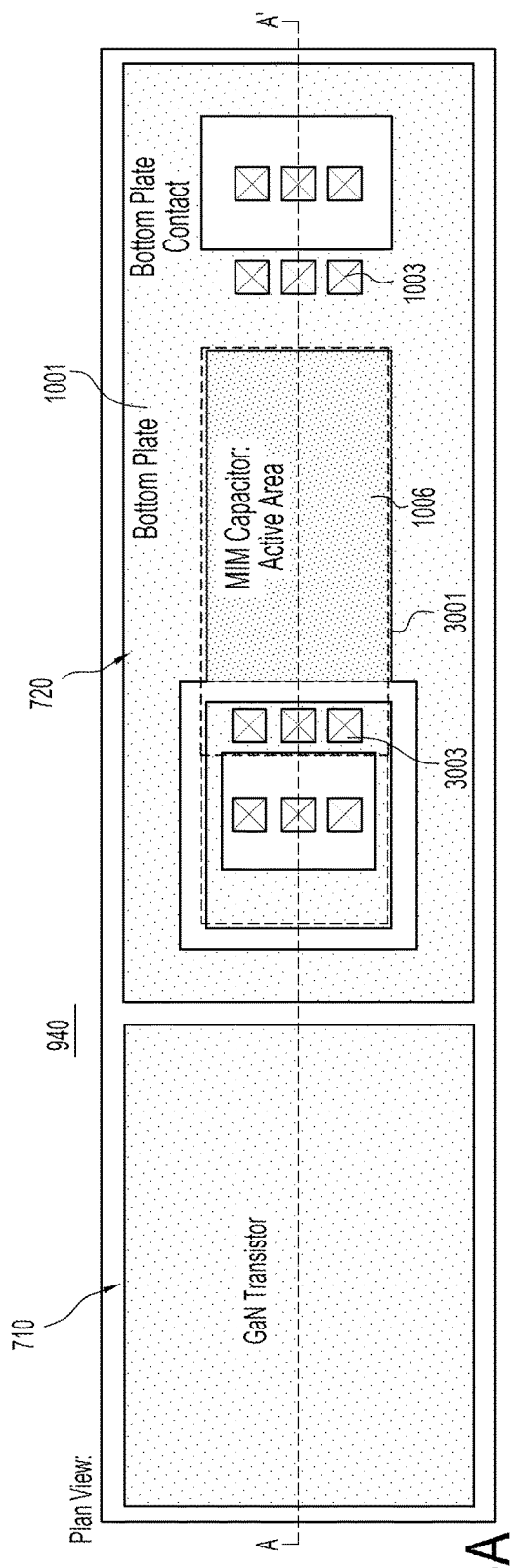
FIGS. 16A and 16B illustrate a plan view d a cross section view of a still further embodiment of the integrated circuit of the present invention.
Figure 16B:
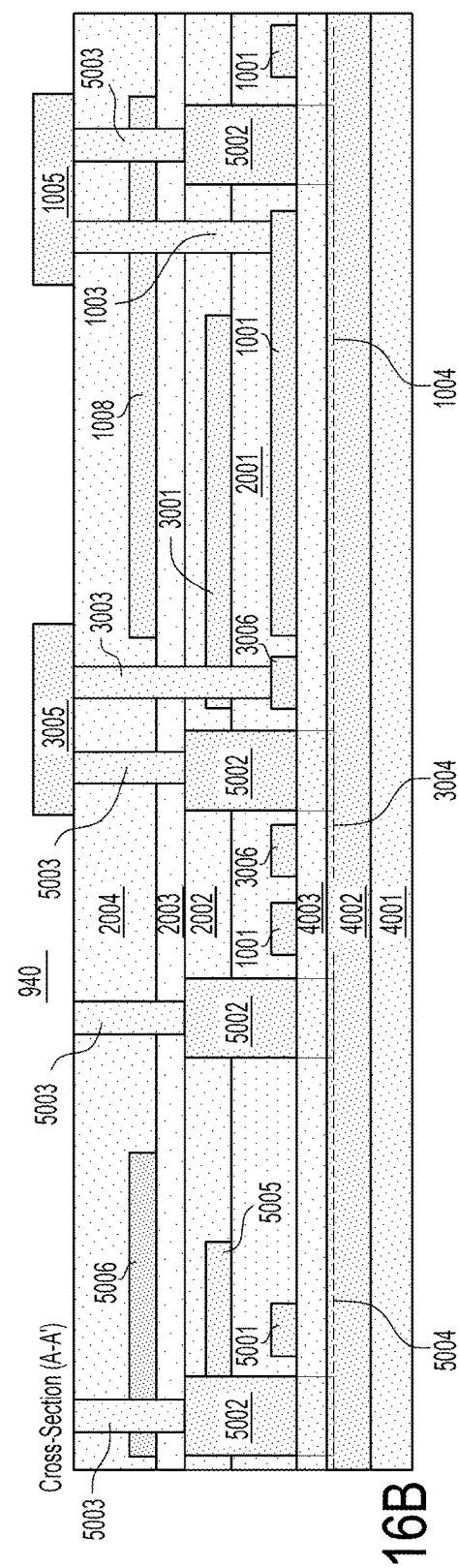

FIGS. 16A and 16B illustrate a plan view and a cross section view of integrated circuit 940, a still further embodiment of the present invention in which capacitor 720 is formed of three interleaved electrodes, i.e., capacitor bottom plate 1001, capacitor top plate 3001, and a third conductive plate 1008 formed from the same metal layer as second field plate 5006, preferably a thin TiN layer. The third capacitor electrode/plate 1008 is preferably contacted by tungsten plug via 1003, and conductively connected to the capacitor bottom electrode 1001 by tungsten plug via 1003. The three interleaved electrodes, i.e., capacitor bottom electrode 1001, capacitor top electrode 3001, and third electrode 1008, increase the capacitance per area of capacitor 720.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. An integrated circuit, comprising:
    a gallium nitride field effect transistor (GaN FET) including gate metal formed of a gate metal layer;
    a GaN layer above a substrate; and
    a front barrier layer above the GaN layer;
    wherein a two-dimensional electron gas (2DEG) is formed at the interface between the GaN layer and the front barrier layer;
    a first field plate disposed over the GaN FET and formed of a field plate metal layer;
    a capacitor including:
        a bottom electrode formed of the gate metal layer, wherein the bottom electrode of the capacitor is electrically connected to the 2DEG by an Ohmic contact; and
        a top electrode formed of the field plate metal layer, wherein the bottom electrode of the capacitor has a portion formed in the shape of a ring surrounding the conductive via, wherein the ring forms a diode with respect to a portion of the 2DEG underlying the ring, to block current flow and increase the voltage breakdown capability of the capacitor in a first polarity direction, when the top electrode is at a higher voltage than the bottom electrode;
    a contact to the top electrode comprising a conductive via which extends through the top electrode; and
    a first dielectric layer disposed between the gate metal and the first field plate, and between the top electrode and the bottom electrode of the capacitor.

2. The integrated circuit of claim 1, wherein the field plate metal layer forming the first field plate and the top electrode of the capacitor comprises titanium-nitride.

3. The integrated circuit of claim 1, wherein the top electrode of the capacitor is electrically connected to the 2DEG by an Ohmic contact.

4. The integrated circuit of claim 1, wherein the conductive via conductively connects a top contact of the integrated circuit to the top electrode of the capacitor.

5. The integrated circuit of claim 4, wherein a segment of the gate metal layer serves as an etch stop for the conductive via.

6. The integrated circuit of claim 1, wherein the top electrode of the capacitor is electrically connected to the 2DEG by an Ohmic contact, and an etch stop for the conductive via is formed in the shape of a ring surrounding the Ohmic contact, wherein the ring forms a diode with respect to a portion of the 2DEG underlying the ring, to block current flow and increase the voltage breakdown capability of the capacitor in a second polarity direction opposite to the first polarity direction, when the bottom electrode is at a higher voltage than the top electrode.

7. The integrated circuit of claim 1, further comprising a second dielectric layer common to the FET disposed over the top electrode of the capacitor, and a second field plate common to the FET disposed over the second dielectric layer, wherein the second field plate forms a third capacitor electrode.

8. A method of forming an integrated circuit comprising a GaN FET having a 2DEG region, a gate metal formed from a gate metal layer, a field plate formed from a field plate metal layer over the GaN FET, and a metal-insulator-metal capacitor having a bottom electrode and a top electrode, the method comprising:
    forming the bottom electrode of the capacitor from the gate metal layer, forming the top electrode of the capacitor from the field plate metal layer,
    forming a contact to the top electrode comprising a conductive via which extends through the top electrode to an etch stop, and
    forming at least one dielectric layer common to the GaN FET and the capacitor, the dielectric layer disposed as an insulator between the top and bottom electrodes of the capacitor; and
    forming a portion of the bottom electrode of the capacitor in the shape of a ring surrounding the conductive via, wherein the ring forms a diode with respect to a portion of the 2DEG region underlying the ring to block current flow and increases the voltage breakdown capability of the capacitor in a first polarity direction, when the top electrode is at a higher voltage than the bottom electrode.

9. The method of claim 8, further comprising forming an Ohmic contact to connect the top electrode of the capacitor to the 2DEG region and forming the etch stop for the conductive via in the shape of a ring surrounding the Ohmic contact, wherein the ring forms a diode with respect to a second portion of the 2DEG region underlying the ring to block current flow and increase the voltage breakdown capability of the capacitor in a second polarity direction, when the bottom electrode is at a higher voltage than the top electrode.

* * * * *